United States Patent [19]

Lemkey

[11] 4,012,241
[45] Mar. 15, 1977

[54] DUCTILE EUTECTIC SUPERALLOY FOR DIRECTIONAL SOLIDIFICATION

[75] Inventor: Franklin D. Lemkey, Glastonbury, Conn.

[73] Assignee: United Technologies Corporation, Hartford, Conn.

[22] Filed: Apr. 22, 1975

[21] Appl. No.: 570,923

[52] U.S. Cl. .................................. 148/32; 75/170; 75/171; 148/32.5
[51] Int. Cl.² ........................................ C22C 19/03
[58] Field of Search ............... 75/171, 170; 148/32, 148/32.5

[56] References Cited

UNITED STATES PATENTS

| | | | |
|---|---|---|---|
| 2,542,962 | 2/1951 | Kinsey | 75/170 |
| 3,904,403 | 9/1975 | Komatsu et al. | 75/170 |

*Primary Examiner*—R. Dean
*Attorney, Agent, or Firm*—Charles E. Sohl

[57] ABSTRACT

This disclosure relates to a eutectic alloy, and article made from the alloy, in the nickel-aluminum-molybdenum system which may be directionally solidified to produce a microstructure consisting of a ductile matrix phase of gamma prime or gamma prime/gamma containing a reinforcing fibrous or lamellar refractory metal alpha second phase. The nominal composition of the base alloy is 8 weight percent aluminum, 27 weight percent molybdenum, balance nickel. Minor elemental additions may be made to modify the mechanical properties of the first phase and/or the second phase. The directionally solidified alloy of the invention is characterized by exceptional anisotropic tensile properties, high isotropic ductilities, combined with good oxidation resistance and satisfactory sulfidation resistance at elevated temperatures.

4 Claims, 5 Drawing Figures

10μ

TRANSVERSE SECTION

TEMPERATURE DEPENDENCE OF ULTIMATE STRENGTH AND ELONGATION FOR Mo STRENGTHENED Ni₃Al EUTECTIC (2 CM/HR)

10μ

TRANSVERSE SECTION

100μ

LONGITUDINAL SECTION

DUCTILE EUTECTIC SUPERALLOY FOR DIRECTIONAL SOLIDIFICATION

BACKGROUND OF THE INVENTION

1. Field of the Invention

This invention relates to the field of nickel base superalloys used in applications where mechanical stresses are encountered at high temperatures. This invention is also related to the field of directionally solidified eutectics wherein an alloy of approximately eutectic composition may be directionally solidified so as to produce an aligned microstructure having anisotropic mechanical properties. The alloy of the present invention is a nickel base superalloy of approximately gamma prime-alpha eutectic composition which may be directionally solidified to produce articles having exceptional mechanical properties combined with adequate oxidation and sulfidation resistance at elevated temperatures.

2. Description of the Prior Art

It is now known that certain eutectic alloys respond to proper directional solidification conditions to produce useful second phase aligned microstructures as described in the patent to Kraft, U.S. Pat. No. 3,124,452. In a patent to Thompson, U.S. Pat. No. 3,554,817 there is described a promising pseudo binary eutectic alloy occurring between the inter-metallic compounds $Ni_3Al$ and $Ni_3Cb$ which responds to plane front solidification to produce a casting characterized by an aligned lamellar microstructure. As so cast this combination provides one of the strongest nickel base alloys known although its ductility is less than that of most nickel base superalloys. As is the case with most nickel base alloys, however, improvements in oxidation and sulfidation resistance are desired to permit maximum utilization of the strength characteristics of the alloy at very high temperatures i.e. >1000° C. And even though in its usual application a given alloy may be provided with surface protection for increased oxidation erosion resistance, improvements in corrosion resistance in the underlying substrate are nevertheless desirable.

In a prior patent to Thompson and Lemkey, U.S. Pat. No. 3,564,940 there is described a class of compositions which solidify according to the monovariant eutectic reaction providing aligned polyphase structures including such systems as the ternary alloys identified as cobalt-chromium-carbon and nickel-aluminum-chromium. The advantage of compositions of this nature is that the desired microstructure can be achieved over a range of compositions in a given system. This provides a substantial increase in the freedom of selection of compositions permitting increased optimization of properties. In U.S. Pat. No. 3,671,223 the concept has been further developed to include those systems which solidify according to the multivariant eutectic reaction where two or more solid phases (N) crystalize simultaneously from the liquid consisting of (N+2) or more components.

U.S. Pat. No. 3,617,397 to Maxwell, assigned to the present assignee discloses a nickel base superalloy which contains 8 percent aluminum and 18 percent molybdenum. This alloy is far from the eutectic point and the patent does not disclose the benefits available in the directionally solidified eutectic.

U.S. Pat. No. 3,793,010 to Lemkey and Thompson discloses a eutectic article which consists of a gamma prime matrix with an aligned delta second phase.

The most accurate previous work on the nickel-aluminum-molybdenum alloys is described in "The Form of the Equilibrium Diagrams of Ni-NiAl-Mo Alloys" Academy of Sciences USSR, 132, May-June 1960, pp 491–495, however this reference does not discuss the eutectic reaction in question.

SUMMARY OF THE INVENTION

The present invention includes a nickel base superalloy of gamma prime-alpha eutectic composition with a nominal composition of 8 percent aluminum, 27 percent molybdenum, balance essentially nickel and a directionally solidified article made thereof. This alloy may be cast and directionally solidified so as to produce a microstructure having a gamma prime ($Ni_3Al$) matrix and an alpha body centered cubic (Mo) second phase in either fibrous or lamellar form. Other elements chosen from the group consisting of chromium, tungsten, niobium, rhenium, and tantalum may be incorporated into the alloy. A directionally solidified article of nominal composition will contain approximately 26 volume percent of the reinforcing second phase. The matrix and the reinforcing second phase both have the [100] crystallographic direction parallel to the direction of solidification. The [100] crystallographic direction is a low Young's modulus direction and this is important since it results in improved thermal fatigue resistance.

The directionally solidified alloy and article are characterized by extremely high ductility at room temperature, on the order of 20 percent. Since both the matrix and reinforcing second phase have a significant amount of ductility, thermal fatigue damage which has been a problem in prior eutectic alloy systems is minimized by internal stress relief by plastic deformation of the matrix and/or reinforcing second phase. Directionally solidified eutectics heretofore known in the art have been characterized by low ductilities, and particularly low transverse ductilities. The directionally solidified alloy and article of the present invention have longitudinal and transverse ductilities which are comparable to conventional nickel superalloys.

In the following description of the preferred embodiments, the term fibrous will be used to mean both rod like and plate like morphologies. All percent figures are weight percent unless otherwise specified.

The foregoing, and other objects, features and advantages of the present invention will become more apparent in the light of the following detailed description of the preferred embodiment thereof as shown in the accompanying drawing.

BRIEF DESCRIPTION OF THE DRAWING

Comparative values for a conventional nickel base superalloy, B1900 are also shown.

DESCRIPTION OF THE PREFERRED EMBODIMENT

Figure 1:
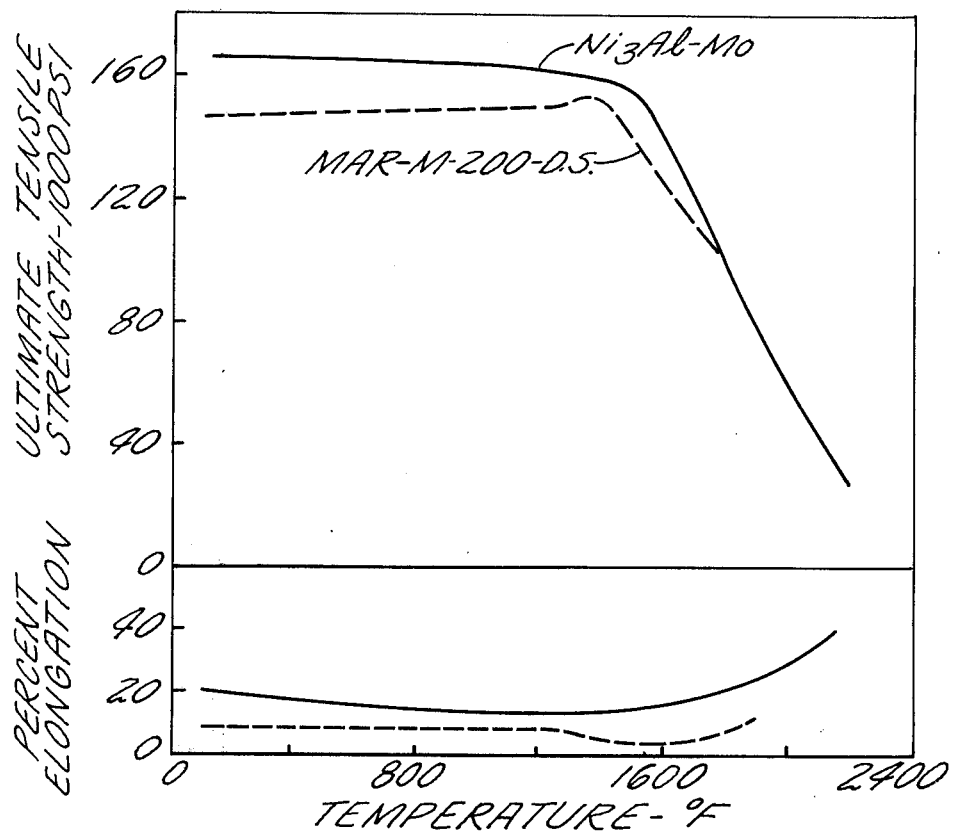
FIG. 1 shows the mechanical properties of the alloy, as directionally solidified to produce an article, of the invention as a function of temperature. Comparative properties of a conventional commercial nickel base superalloy, MAR-M200 are shown for comparison.

The nominal composition of the eutectic alloy of the invention is 8 percent aluminum, 27 percent molybdenum, balance essentially nickel. A directionally solidified alloy article having eutectic composition will have a gamma prime matrix containing alpha molybdenum rods or plates. At the eutectic composition there will be approximately 26 volume percent of the second reinforcing phase. The aluminum range is preferably maintained at a level between 7 and 8.5 percent and most preferably between 7.4 and 8.0 percent. The aluminum level has at least two effects on the microstructure of the directionally solidified alloy and article. If aluminum is present in levels much below the 8 percent nominal eutectic level, the gamma prime matrix will contain small tough particles of the gamma phase. In other nickel-base superalloy systems it has been found that alloys containing a mixture of gamma and gamma prime phases have better mechanical properties than alloys which contain either gamma prime alone or gamma alone. For this reason the aluminum level of the present invention is preferably maintained between 7.4 and 8 percent so as to induce the formation of a gamma prime matrix reinforced with gamma particles. At 7.4 percent aluminum, the matrix contains about 35 volume percent gamma, and at 8.0 percent aluminum the matrix is essentially all gamma prime. The second way in which aluminum levels influences the microstructure is by influencing the second phase morphology: low alumimum levels promote the formation of a lamellar or plate-like structure while high aluminum levels promote the formation of a rod type second phase structure.

The nominal molybdenum level of the directionally solidified alloy and article of the present invention is about 27 percent. It is preferred that the molybdenum level be maintained at a level of between 25 and 28 weight percent. The effect of varying the molybdenum level is to vary the volume fraction of the reinforcing second phase. For most applications it will be found desirable to maximize the volume fraction of the second phase. It is preferred that the alloys of the invention contain more than 20 volume percent of the reinforcing aligned second phase.

The present invention also contemplates the modification of the second phase by the addition of one or more elements chosen from the group consisting of chromium, tungsten, rhenium, niobium and tantalum. Additions of these elements may be made up to levels which detrimentally affect the directional solidification characteristics of the alloy. It is believed that preferred levels of these elements will be on the order of about 10 percent. The elements in this group will largely partition to the alpha second phase rather than to the matrix.

In certain temperature ranges the second phase may oxidize preferentially where it is exposed to the atmosphere. If it is desired to maximize the useful life under these conditions chromium may be added to improve the oxidation resistance of the second phase. Tungsten may be added to increase the creep resistance and has a further effect in that it increases the range over which rods will be formed as the second phase, as opposed to plates. Chromium increases the range over which plates will be formed rather than rods.

A number of alloying ingredients are known to have profound effects on properties even when present only in very small amounts. Yttrium and the rare earth elements for example in quantities as low as 0.03 weight percent have been found to promote oxide adherence in nickel base superalloys. In some cases quantities of boron, carbon, hafnium, and zirconium have been found to promote creep rupture ductility and in some cases cause a pronounced reduction in the tendency of such materials to grain boundary oxidation. Those modifications to the nominal alloy composition which provide advantageous results in the article without interfering with the development of the desired microstructure may be made.

EXAMPLE I

Figure 4:
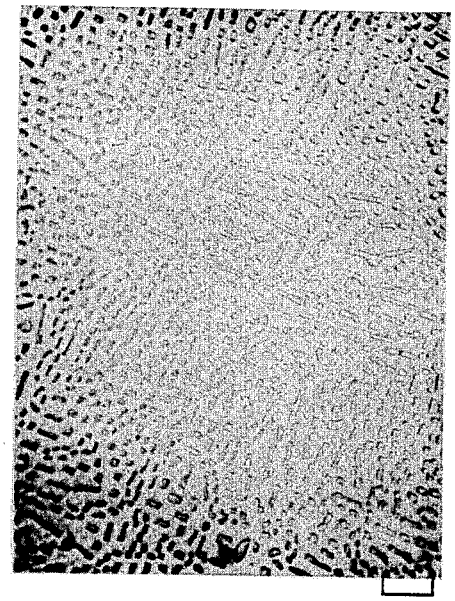
FIG. 4 shows a transverse micrograph of the alloy article of the invention after directional solidification.
Figure 5:
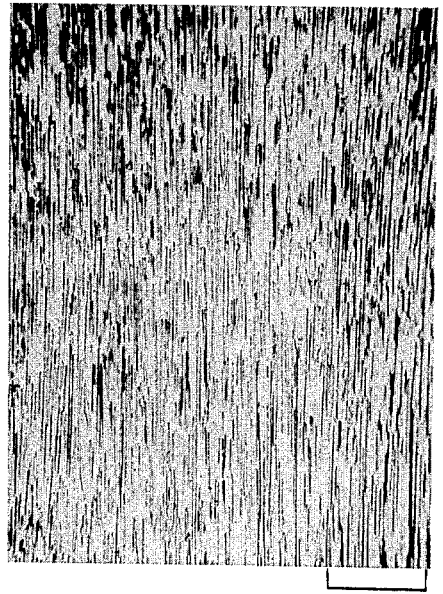
FIG. 5 shows a longitudinal micrograph of the alloy article of the invention after directional solidification.

Tensile samples of the alloy of the present invention with the nominal composition of 8 percent aluminum and 27 percent molybdenum were prepared by directional solidification at a rate of 2 centimeters per hour under conditions which produced an article with a fibrous second phase microstructure. The microstructure was oriented along the long axis of the tensile samples. The longitudinal and transverse microstructures are shown in FIGS. 4 and 5 respectively. These samples were tested in tension at a series of temperatures from 70° to 2200° F. FIG. 1 shows the ultimate tensile strength and percent elongation of the present invention as a function of test temperature. FIG. 1 also shows comparative data for a commercial nickel base superalloy, MAR-M200 which has a nominal composition of 9 percent chromium, 10 percent cobalt, 2 percent titanium, 5 percent aluminum, 0.15 percent carbon, 12.5 percent tungsten, 1 percent columbium, 0.015 percent boron, 0.05 percent zirconium, and 1.5 percent hafnium balance nickel. This alloy was tested in a directionally solidified condition and had an elongated grain structure. Referring now to FIG. 1 it can be seen that in terms of ultimate tensile strength the alloy and article of the present invention are significantly better than the conventional nickel base superalloy. In terms of elongation the alloy and article of the present invention which has a minimum ductility of about 15 percent is clearly superior to the conventional nickel base superalloy which has a maximum ductility on the order of 10 percent. The conventional nickel base superalloy, MAR-M200 is an alloy having what is generally considered to be the best high temperature mechanical properties of any alloy in commercial use. Thus it is significant that the alloy of the present invention when directionally solidified to form an article has mechanical properties, both tensile strength and elongation, which are clearly superior to the best conventional alloy.

EXAMPLE II

Samples of the invention were prepared as described in Example I and tested to rupture over a range of temperature. The results are presented in FIG. 2 along with similar data for two conventional superalloys, MAR-M200, having a composition as set forth in Example I and TRW-NASA-VI A having a nominal composition of 7.5 percent cobalt, 6.0 percent chromium, 2 percent molybdenum, 5.5 percent aluminum, 1 percent titanium, 6.0 percent tungsten, 0.5 percent rhenium, 0.15 percent zirconium, 0.02 percent boron, 9 percent tantalum, 0.5 percent niobium, balance essentially nickel. TRW-NASA-VI A is an experimental alloy which is considered to be one of the strongest conventional nickel base superalloys.

Figure 2:
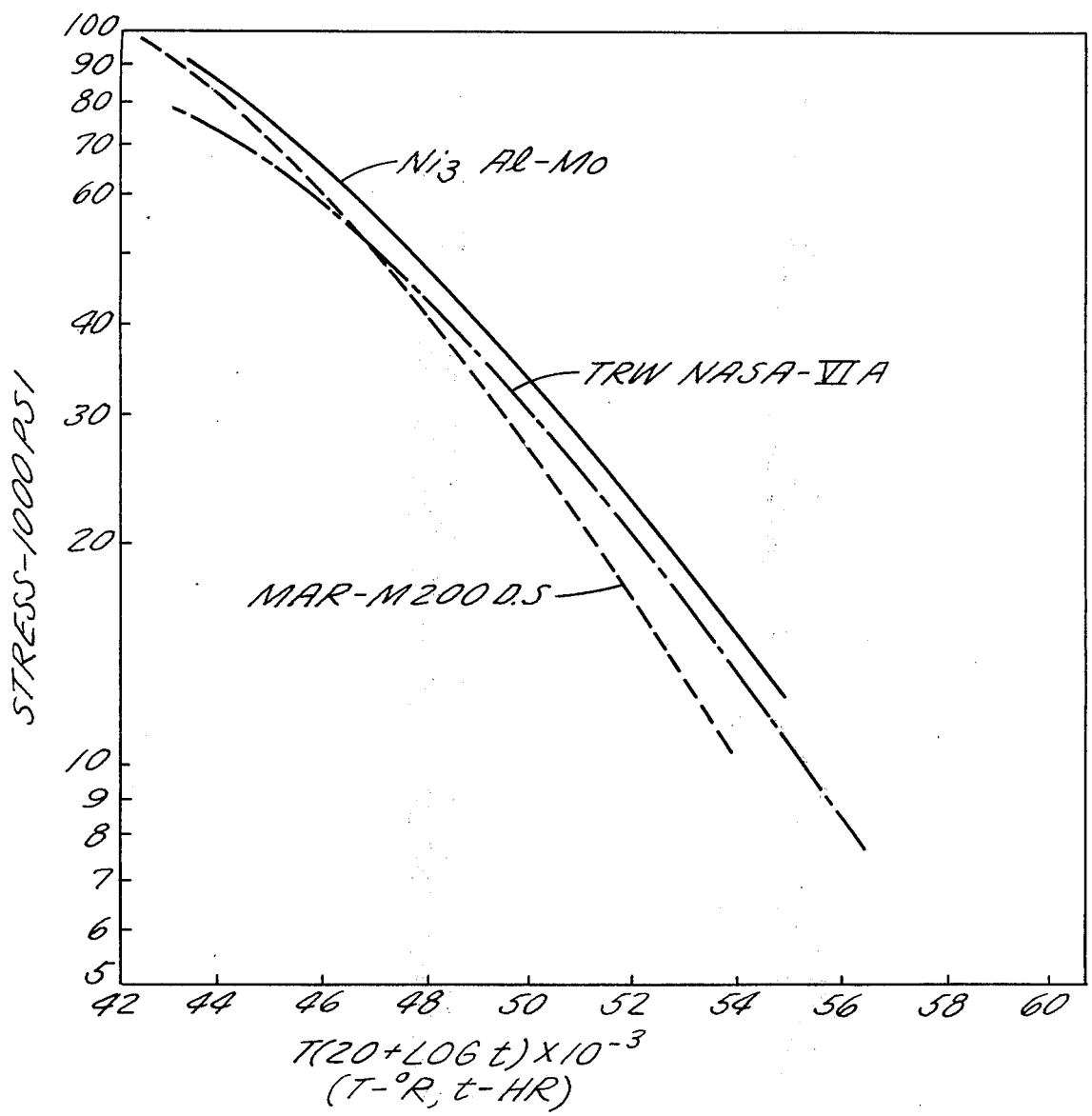
FIG. 2 shows a stress rupture plot showing the performance of the present alloy, as directionally solidified to produce an article. Comparative data is shown for conventional nickel base superalloys, TRW-NASA-VI A and MAR-M200 D.S.

The Larson Miller parameter combines time and temperature. FIG. 2 indicates that the directionally solidifed alloy and article of the present invention are stronger under all conditions tested than the conventional alloys which are considered to be the strongest available.

EXAMPLE III

Figure 3:
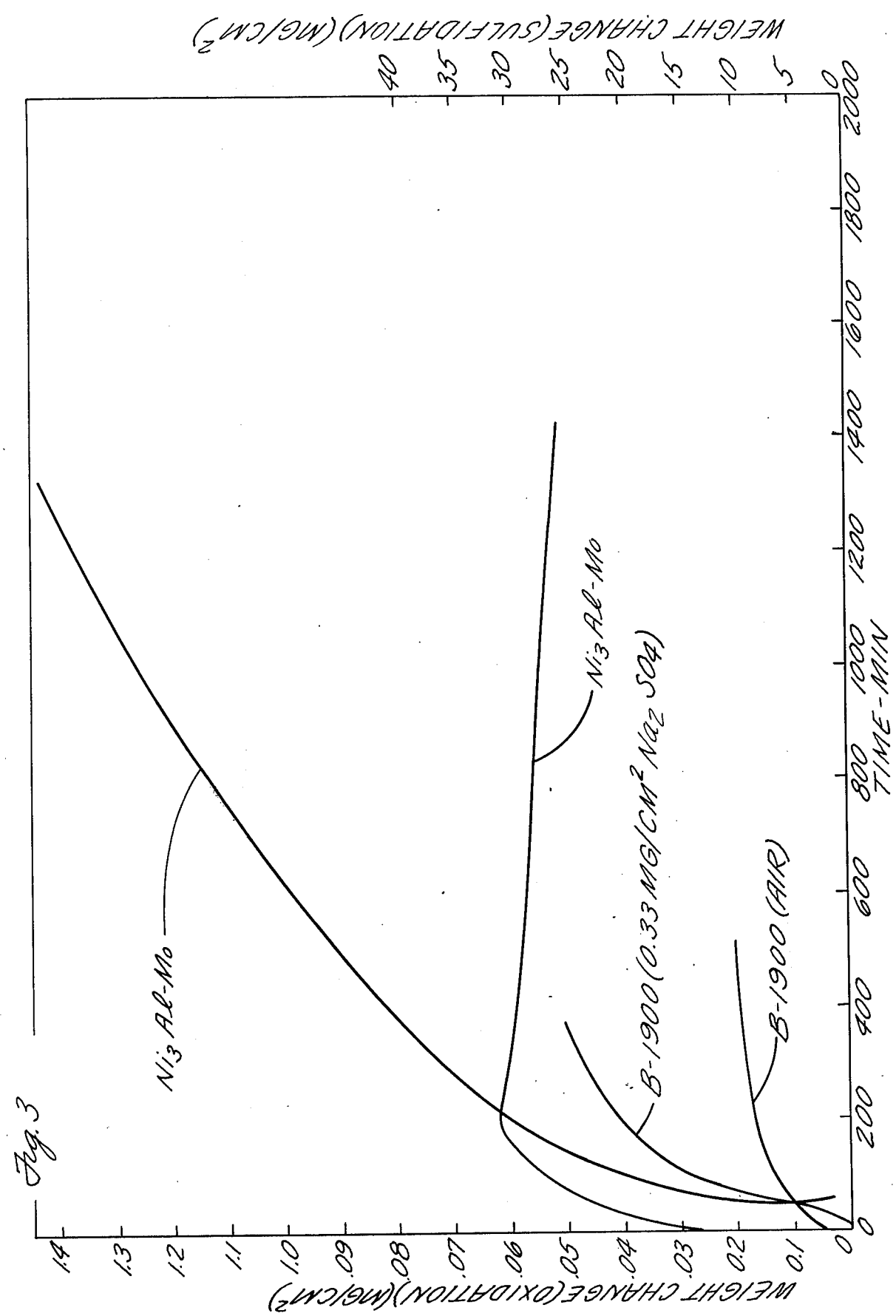
FIG. 3 shows the oxidation and sulfidation performance of the present alloy, as directionally solidified to produce an article, as a function of time at 1,000° C.

In this example, directionally solidified article samples of the present alloy were exposed to oxidizing and sulfidizing conditions at a temperature of 1,000° C for a variety of times. Oxidation and sulfidation performance was evaluated by measuring weight change. A small weight change is indicative of a low rate of oxidation or sulfidation. The results are shown in FIG. 3 along with similar data for a conventional nickel base superalloy B1900, having a nominal composition of 8 percent chromium, 6 percent aluminum, 1 percent titanium, 6 percent molybdenum, 10 percent cobalt, 0.1 percent carbon, 0.075 percent boron, 0.017 percent zirconium, 4.3 percent tantalum, balance essentially nickel. This alloy is considered to have the best oxidation resistance of any conventional alloy. Referring now to FIG. 3, it is apparent that the present invention has oxidation and sulfidation properties which are of the same order of magnitude as the best conventional alloy. Because of the low Young's modulus and the low coefficient of thermal expansion, the invention is projected to be resistant to spallation of the protective alumina film which forms under oxidizing conditions. Thus, if cyclic tests were performed where the material in test is cycled below a low and high temperature to simulate actual operating conditions, the alloy and article of the invention may well equal or surpass the conventional alloys in oxidation and sulfidation performance.

In considering oxidation and sulfidation, it is important to recognize that although all present superalloys are used in a coated form in gas turbines, nevertheless the substrate properties are important to long life.

Although the invention has been shown and described with respect to a preferred embodiment thereof, it should be understood by those skilled in the art that various changes and omissions in the form and detail thereof may be made therein without departing from the spirit and the scope of the invention.

Having thus described a typical embodiment of our invention, that which I claim as new and desire to secure by Letters Patent of the United States is:

1. A directionally solidified nickel alloy article, of essentially eutectic composition having a matrix comprised predominantly of gamma prime ($Ni_3Al$) and at least 20 volume percent of an alpha (Mo) fibrous second phase in an aligned form.

2. An article as in claim 1 wherein the matrix contains up to 35 volume percent of gamma phase in particulate form.

3. An article as in claim 2 which contains from about 7.0 to about 8.5 percent aluminum, from about 25 to about 28 percent molybdenum, balance essentially nickel.

4. An article as in claim 3 which further contains up to about 10 percent of one or more elements chosen from the group consisting of chromium, tungsten, rhenium, niobium, tantalum, and mixtures thereof.

* * * * *